United States Patent [19]

Bacon et al.

[11] Patent Number: 4,482,443
[45] Date of Patent: Nov. 13, 1984

[54] PHOTOELECTROCHEMICAL ETCHING OF N-TYPE SILICON

[75] Inventors: Duane E. Bacon, Lee's Summit, Mo.; Jeffrey R. Bessette, Piscataway; Paul A. Kohl, Chatham, both of N.J.

[73] Assignees: AT&T Technologies, New York, N.Y.; AT&T Bell Laboratories, Murray Hill, N.J.

[21] Appl. No.: 567,050

[22] Filed: Dec. 30, 1983

[51] Int. Cl.³ .............................. C25F 3/12; C25F 3/14
[52] U.S. Cl. .......................... 204/129.3; 204/129.75; 204/129.8; 204/129.85; 204/129.95
[58] Field of Search ............. 204/129.3, 129.75, 129.8, 204/129.95, 129.85

[56] References Cited

U.S. PATENT DOCUMENTS

| | | | |
|---|---|---|---|
| 2,861,931 | 11/1958 | Faust, Jr. | 204/129.85 X |
| 3,041,258 | 6/1962 | Sikina | 204/129.75 X |
| 3,079,536 | 2/1963 | McLean | 204/129.3 X |
| 3,527,682 | 9/1970 | Valvo | 204/129.85 X |
| 4,389,291 | 6/1983 | Kohl | 204/129.3 |
| 4,399,004 | 8/1983 | Buckley | 204/15 |
| 4,404,072 | 9/1983 | Kohl | 204/129.3 |
| 4,415,414 | 11/1983 | Burton et al. | 204/129.3 |

OTHER PUBLICATIONS

"Photoetching of InP Mesas for Production of MM-Wave Transferred Oscillators", *Electronics Letters*, 13, D. Lubzens, pp. 171–172, (1977).

*Primary Examiner*—Donald R. Valentine
*Attorney, Agent, or Firm*—Walter G. Nilsen

[57] ABSTRACT

Photoelectrochemical processing of semiconductors is highly desirable because of its versatility and simplicity. The invention is a photoelectrochemical etching procedure for n-type silicon in which an alcohol based solution of hydrofluoric acid is used as the electrolyte. This procedure is useful for the fabrication of a variety of silicon devices.

12 Claims, 4 Drawing Figures

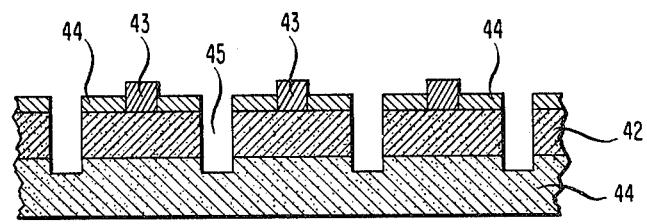
FIG. 3
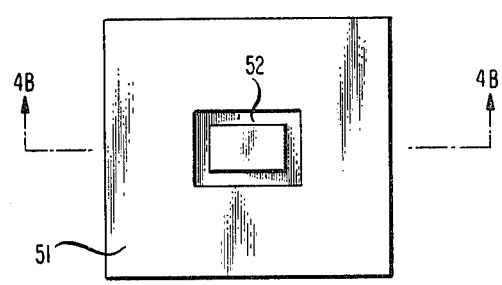
FIG. 4
FIG. 4A
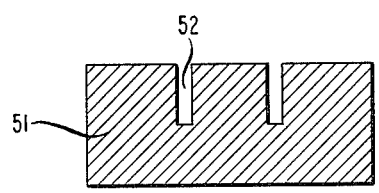
FIG. 4B 4,482,443

PHOTOELECTROCHEMICAL ETCHING OF N-TYPE SILICON

TECHNICAL FIELD

The invention is a photoelectrochemical procedure for etching n-type silicon.

BACKGROUND OF THE INVENTION

Great advances have been made in semiconductor technology in the last few years due to the discovery of new fabrication techniques, the smaller size of geometrical features on semiconductor devices and the greater accuracy in placing certain geometrical features on semiconductor devices. In this way, various integrated circuits have been developed in which the circuit elements including semiconductor circuit elements are made directly on the semiconductor material. As time passed and fabrication techniques improved, the density of circuit elements has increased. Tolerance limits have become more demanding, geometrical features smaller and more precise and placement accuracy more precise.

The revolution in semiconductor technology has been most apparent in silicon semiconductor technology. Most semiconductor devices are made with this material. It is readily available in large boules, has excellent mechanical properties, can easily be purified and is relatively well understood as far as semiconductor properties are concerned.

Semiconductor technology has advanced to such a state with silicon that devices with design parameters of about one micrometer are being manufactured. Memories with storage capacities of about 256,000 bits plus associated circuitry are being made on silicon chips with area of about one square centimeter. Other examples are available to show the large advances that have been made in silicon technology in the last few years.

In fabricating such devices, it would be highly advantageous to have an etching procedure which can be controlled as to etch rate, area to be etched and geometrical shape to be etched. Such an etching procedure is usually referred to as an anisotropic etching procedure. Such a procedure would be useful for making channels, via holes, mirrors, lenses, diffraction gratings and in the separation of individual chips on a semiconductor wafer.

Photoelectrochemical etching of III-V semiconductor compounds has been described in a variety of publications including U.S. Pat. No. 4,389,291, issued to P. A. Kohl et al on June 21, 1983; U.S. Pat. No. 4,399,004, issued to R. R. Buckley et al on Aug. 16, 1983; U.S. Pat. No. 4,404,072, issued to P. A. Kohl et al on Sept. 13, 1983; and D. Lubzens, "Photoetching of InP Mesas for Production of MM-Wave Transferred Oscillators," *Electronics Letters*, 13, page 171 (1977).

SUMMARY OF THE INVENTION

The invention is a photoelectrochemical etching procedure for n-type silicon in which the electrolytic solution contains alcohol and fluoride ion. Generally, an aliphatic alcohol is used with up to 10 carbon atoms. Lower molecular weight alcohols are preferred (1–3 carbon atoms) with methanol most preferred. Usually an additive in the form of a salt is added to increase conductivity. The fluoride can be added in a variety of forms including hydrofluoric acid, fluoride salts, etc. Excellent results are obtained with HF and HCl in methanol (preferred concentration ranges from 0.1 to 5M for each acid) and $NH_4F_2H$ and KF in methanol. The process involves applying an electrochemical potential to the n-type silicon while the n-type silicon is in contact with an electrolytic solution. The magnitude of the potential at the semiconductor surface should be within a specific range determined by the properties of the n-type silicon in the particular electrolytic solution. The surface to be etched is illuminated with radiation of sufficient energy to create holes in the valence band. The procedure is used to produce a variety of geometric shapes including slots to separate individual chips from a wafer, lenses, cylindrical holes, etc. Particularly advantageous is the smooth surfaces produced in the outlined etching process.

BRIEF DESCRIPTION OF THE DRAWING

FIG. 3 shows a side view of a silicon wafer with etched slots prior to separation into discrete diode devices; and FIG. 4 shows both a top view and sectioned side view of an insulated region of a silicon integrated circuit.

DETAILED DESCRIPTION

Figure 1:
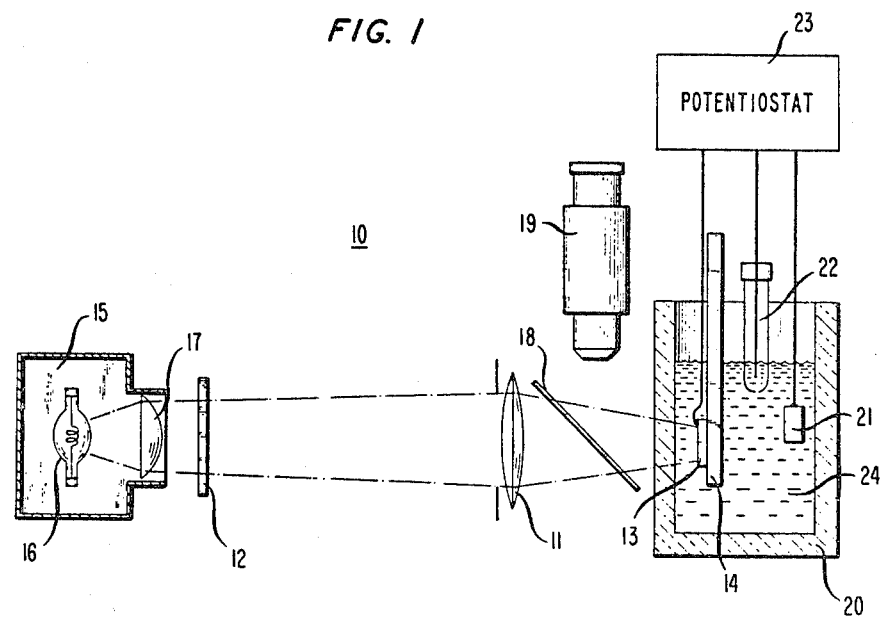
FIG. 1 shows a typical apparatus useful in the practice of the invention.

The invention is a photoelectrochemical etching process for n-type silicon in which the etching process is carried out in an alcohol solution containing fluoride ion. The nature of the solution is of particular importance in assuring reasonable etch rates and excellent etching results. The process involves applying a potential of a certain voltage to the n-type silicon while irradiating the area to be etched with radiation of sufficient energy to produce holes in the valence band of the n-type silicon. To better understand the invention, the process is described below together with the critical process parameters for achieving best results.

In the electrochemical photoetching process, the semiconductor is made part of an oxidation-reduction reaction. The semiconductor is made the anode and a counter-electrode (usually an inert metal such as platinum or platinized titanium) made the cathode. A potential is applied to the semiconductor, the value of which is discussed below. A standard electrode is often used in the process to measure and monitor the electrode potential. Etching results from a decomposition reaction induced by photogenerated holes at the interface between semiconductor and the electrolytic solution.

The process is most applicable to silicon semiconductor material that is n-type. Generally, silicon supplied commercially is n-type without any deliberate doping. It is believed that the photoelectrochemical etching procedure would be applicable to intrinsic or compensated silicon material but such material is not easily available.

The invention is contemplated for essentially pure silicon; that is, silicon containing ordinary impurities and dopants to make it an n-type semiconductor. Generally, the invention is limited to silicon where the n-type donors are greater than the p-type donors. Typically, the dopants are phosphorus or arsenic and generally the dopant concentration is in the range from $10^{15}$ to $10^{19}$ atoms per cubic centimeter.

The surface to be etched is irradiated with light (or radiation) of sufficient energy to generate holes in the valence band which are available at the interface between semiconductor and electrolytic solution. Generally, this requires radiation with energy equal to or greater than the bandgap of the silicon (about 1.12 electron volts at room temperature) but various kinds of impurity states might permit the same results for radiation of slightly lower energy. Either broadband or monochromatic (e.g., lasers) sources may be used. Filters may be used with broadband sources to remove unwanted radiation. Fluorescent sources such as mercury lamps are also useful.

The radiation necessary for etching plays an important part in the etching process and the various procedures that can be carried out on silicon surfaces. At least part of the radiation should be of sufficient energy to create holes in the valence band. Generally, this requirement is met by photon energies greater than the bandgap of silicon (about 1.12 electron volts) but often impurity states in the bandgap permit use of radiation of slightly lower photon energies.

For all practical purposes, etching only takes place in the presence of radiation and the etching rate is proportional to the radiation intensity. Thus, etching is limited to areas of the silicon surface where radiation (of the proper energy) is incident on the surface. Also, the nature of the radiation (e.g., ray direction and spatial intensity variation) can be used to obtain various geometrical features on the silicon surface. For example, use of collimated light through a mask results in straight-walled geometric features such as holes and slots (see U.S. Pat. No. 4,389,291 issued to P. A. Kohl et al on June 21, 1983). Also, judiciously planned intensity variations in the incident radiation give rise to such geometrical features as lenses, etc. (see for example, application Ser. No. 416,473 filed Sept. 10, 1982, now U.S. Pat. No. 4,415,414).

A power source is used to supply the potential to the semiconductor and to drive the oxidation-reduction reaction. Meters are used to measure the potential applied to the semiconductor in terms of a standard cell (usually against a saturated calomel electrode, SCE, also located in the electrolytic solution) and the current. The current is proportional to the etch rate and therefore is a convenient monitor for the etching process.

The potential applied to the semiconductor to be photoetched is particularly important because too high a potential will lead to etching in the absence of radiation and too low a potential will prevent any etching even in the presence of radiation. As a general criteria, the potential should be between the maximum potential of the valence band of the semiconductor in the particular electrochemical solution being used and the flat band potential under these same conditions. The flat band potential is approximately the conduction band minimum for n-type semiconductors and about halfway between valence and conduction band for intrinsic semiconductors. Often these potentials are known or can be found from various literature references. A typical value for n-type silicon is −0.2 volts to +1.0 volts on the SCE scale in methanol containing fluoride ion.

A particular difficulty exists with silicon in alcohol solutions. The applied potential differs considerably from the potential at the semiconductor surface because of the insulating layer between semiconductor and electrolytic solution and the high voltage drop in the alcohol electrolytic solution. The alcohol solution does not have the high conductivity usually associated with aqueous solutions and a significant voltage drop exists in the alcohol solution at the currents used in the photoelectrochemical etching process. For these reasons, applied potentials on the SCE scale are usually in the range from 1 volt to 5 volts so as to ensure the required voltage on the surface of the semiconductor.

A procedure exists for determining the best applied voltage under a particular set of experimental conditions. This procedure involves taking a voltammogram of the semiconductor under the particular conditions that the etch process is to be carried out. Here, the etching rate is measured by observing the current as described above as a function of applied voltage with and without radiation incident on the surface of the silicon. It is found that in one region of potential, high etching (as evidenced by high currents) is observed with radiation but essentially no etching (near zero current) without radiation. It is this region of potential that is of interest in the electrochemical photoetching process.

Various light sources may be used provided at least part of the spectral output contains sufficient energy to create holes in the valence band at the surface of the compound semiconductor. This requirement is most easily met by using radiation with energy equal to or greater than the bandgap of the semiconductor (about 1.12 electron volts). Under some circumstances, light energy less than the bandgap of the compound semiconductor may be used because of energy states in the bandgap. Often, these energy states are due to impurities, doping elements, compensation elements, and crystal imperfections. However, for convenience and etching speed, radiation with energy greater than the bandgap is preferred. Broadband radiation (as from a tungsten lamp) or essentially monochromatic radiation (as from a laser) may be used. Lenses and other optical means may be used to achieve desired ray direction, concentration of radiation, etc.

For many applications, a mask is used to confine the radiation (and therefore the etching) to specific regions. Masks may also be used to vary the etching rate over some portion of the semiconductor surface by varying the light transmission over some portion of the surface. Partially reflecting or absorbing masks may be used. Often photographic emulsions are used in making such masks. Ray direction in the applied radiation is also significant. For example, parallel rays through a mask can be used to etch features with straight walls such as holes or slots with straight, right-angled walls.

The nature of the electrolytic solution is of great importance in the practice of the invention. The electrolytic solution should be sufficiently conductive to permit the oxidation-reduction reaction to take place (e.g., 0.00001 mho/cm) and contain a substituent to remove the oxidation product of the semiconductor from the surface being etched. The main constituent is one or more alcohols with up to 10 carbon atoms. Generally, the alcohol component is the major component in the solution. Of importance is the minimization of water contained in the solution but because of the nature of the components (e.g., HF, HCl), some water is present. It is preferred that the water content be below 5 weight percent. In addition, it is preferred that the solvent be made up of at least 95 weight percent alcohol and more preferred that the solvent contain less than one weight percent water.

Although various alcohols can be used, those with lower numbers of carbons (1-3 carbon atoms) are preferred with methanol most preferred. The preference is believed to be due to the larger amounts of salts that can be dissolved in methanol as compared to other alcohols. This increases the conductivity of the electrolytic solution so that higher etching rates are possible.

Certain substances are added to the alcohol solution so as to ensure removal of the oxidation product of the photoetching procedure and to provide current carriers for electrical conductivity. The electrolytic solution should contain fluoride ion to ensure removal of the silicon oxidation product. The fluoride ion may be introduced in a variety of ways including addition of fluoride salt such as KF, $NH_4F$, etc., the addition of hydrofluoric acid, the addition of $NH_4F_2H$ or similar compound, etc. High concentrations are generally preferred consistent with the solubility in these solvents.

Excellent results are obtained in a number of electrolytic solutions. For example, a combination of HF and HCl in methanol (concentrations from 0.1 to 5 molar for each) yields exceptionally smooth surfaces. The acids are usually added in the form of concentrated aqueous solutions so as to minimize the amount of water in the solution. Naturally, HF gas and HCl gas can be used to eliminate the addition of water to the electrolytic solution but the use of gas is often not as convenient as the use of the concentrated aqueous acids.

Another solution which is less toxic and contains no water from the added chemicals is $NH_4F_2H$ plus KF in methanol. The $NH_4F_2H$ is added so as to form a saturated solution and the concentration of KF is between 0.1 and 5 molar.

The procedure is carried out on an apparatus shown in FIG. 1. This apparatus 10 is essentially a projection system in which an image of a photomask is projected onto the surface of a silicon wafer containing the individual devices to produce the desired light intensity pattern. In the projection system, an imaging lens 11 (a Rodenstock Apo-Rodagon 50 mm, f 2.8 apochromatic enlarging lens) is used to project the photomask 12 onto the semiconductor wafer 13 held in place by a holder 14. The mask 12 is illuminated by a projection light source 15 comprising 100 watt tungstenhalogen lamp 26, condensing system of aspheric collimating lens (inside the box but not shown) and a water filter (not shown). Also used is a lens 17 to focus the filament onto the projection lens. A pellicle beam splitter 18 between the projection lens and the cell directed reflected light from the wafer into a microscope 19 with a long working distance to permit adjustment of the mask image. The cell 20, which is made of plexiglass, is mounted on a stage that allowed 3 translational and 3 rotational degrees of freedom. The orientation and transverse position of the cell 20 are adjusted to align the wafer with respect to the mask image. The longitudinal positions of the lens 11 and the cell 20 are adjusted so that the magnification and focus are correct. The light intensity is adjusted with neutral density filters to give the desired current density. Also present in the electrochemical cell is a counter-electrode 21 made of platinum metal and a SCE reference electrode 22, the electrochemical reaction was electrically powered by a potentiostat 23.

Figure 2:
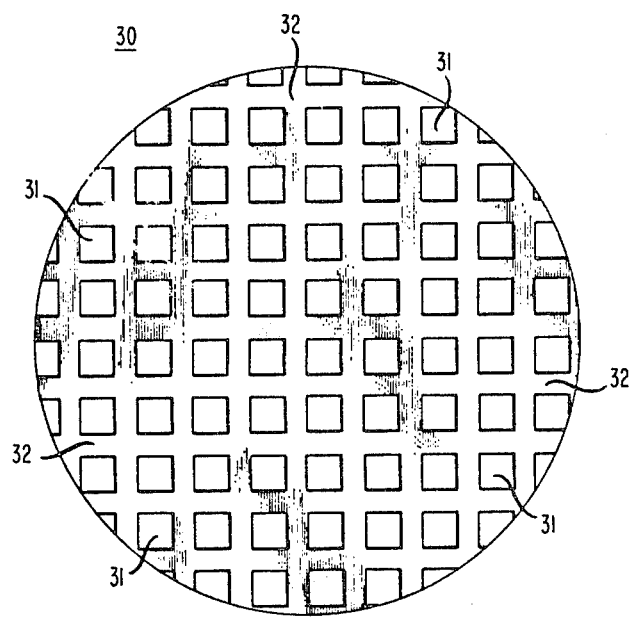
FIG. 2 shows a typical silicon wafer where slots are etched to separate the wafer into individual devices.

FIG. 2 shows a silicon wafer 30 with individual chips 31 and slots 32 made in accordance with the invention.

FIG. 3 shows a cross-sectional view of part of a wafer 40 with diode structures made up of p-type silicon 41, n-type silicon 42, metal electrode 43, and insulator 44 (generally silicon dioxide). The width of the n-type and p-type regions is about 50 $\mu$m. In order to maximize breakdown voltage, the diodes should be separated with minimum damage to the n-type silicon. This is done by etching through the n-type silicon region 45 before separating (usually by breaking) the individual diodes. When the etching is done in accordance with the invention, straight-walled slots are produced which minimize diode density on the wafer.

FIG. 4 shows a silicon semiconductor device 50 (details not shown) with silicon material 51 and insulating moat 52 made by etching a narrow channel in the silicon and growing oxide in the channel to form the insulating moat. The moat is used to isolate electrically a part of the semiconductor circuit.

What is claimed is:

1. A process for fabricating a device comprising n-type silicon semiconductor comprising the step of etching at least part of the semiconductor characterized in that the etching procedure is an electrochemical photoetching procedure in which electric current is passed through the semiconductor, electrolytic solution with conductivity greater than 0.00001 mhos/cm and anode in which the electrochemical photoetching procedure further comprises:
   a. applying a potential to the semiconductor which is between the maximum potential of the valence band of the semiconductor in the electrolytic solution and the minimum potential of the conduction band of the semiconductor in the electrolytic solution;
   b. illuminating the part of the surface of the semiconductor to be etched with radiation of sufficient energy to produce holes in the valence band;
   c. the electrolytic solution comprises solvents and fluoride ions, said solvents comprising alcohol with up to 10 carbon atoms, said solvent having less than 5 weight percent water.

2. The process of claim 1 in which the solvent consists of less than 1 weight percent water.

3. The process of claim 2 in which the solvent consists essentially of alcohol with up to 10 carbon atoms.

4. The process of claim 3 in which the solvent consists essentially of methanol.

5. The process of claim 1 in which the electrolytic solution comprises HF.

6. The process of claim 5 in which the electrolytic solution comprises HF and HCl both in the concentration range from 0.1 to 5 molar.

7. The process of claim 1 in which the electrolytic solution comprises $NH_4F_2H$.

8. The process of claim 7 in which the $NH_4F_2H$ forms a saturated solution and KF is present in a concentration range between 0.1 and 5 molar.

9. The process of claim 1 in which the silicon is doped with phosphorus or arsenic in the concentration range from $10^{15}$ to $10^{19}$ atoms per cubic centimeter.

10. The process of claim 1 in which the photon energy of the radiation is greater than 1.12 electron volts.

11. The process of claim 1 in which the applied potential at the semiconductor surface is between −0.2 volts and +1.0 volts on the SCE scale.

12. The process of claim 1 in which the applied potential on the SCE scale is between 1 volt and 5 volts.

* * * * *